US005416370A

United States Patent [19]

Takatori et al.

[11] Patent Number: 5,416,370

[45] Date of Patent: May 16, 1995

[54] MULTIPLICATION CIRCUIT

[75] Inventors: Sunao Takatori; Makoto Yamamoto, both of Tokyo, Japan

[73] Assignee: Yozan Inc., Tokyo, Japan

[21] Appl. No.: 152,171

[22] Filed: Nov. 16, 1993

[30] Foreign Application Priority Data

Nov. 16, 1992 [JP] Japan .................................. 4-330003

[51] Int. Cl.[6] .......................... G06G 7/16; H03B 19/00

[52] U.S. Cl. .................................... 327/356; 327/408; 327/410

[58] Field of Search ............... 307/571, 529, 501, 497, 307/243, 201, 359, 498; 328/160, 104, 158

[56] References Cited

U.S. PATENT DOCUMENTS

| | | | |
|---|---|---|---|
| 3,502,990 | 3/1970 | Bradmiller | 328/104 |
| 3,681,699 | 8/1972 | Kelly et al. | 328/104 |
| 3,781,912 | 12/1973 | McCollum, Jr. | 328/104 |
| 3,935,539 | 1/1976 | Linder | 328/160 |
| 4,524,326 | 6/1985 | Larson | 307/529 |
| 4,999,521 | 3/1991 | Rusznyak | 307/529 |

OTHER PUBLICATIONS

Electrical Engineering Handbook, Editor-in-Chief, Richard C. Dorf, pp. 1861-1865, CRC Press 1993.

Iwai, Rikuji, "The Beginning of Logical Circuit", Tokyo Denki Daigaku, Suppankyoku, 1980, pp. 144-146.

Miyazaki, Seiichi, "The Analog Usage Handbook", CQ Suppan Kabushikigaisha, pp. 139-140, 1992.

*Primary Examiner*—Timothy P. Callahan
*Assistant Examiner*—Terry L. Englund
*Attorney, Agent, or Firm*—Cushman, Darby & Cushman

[57] ABSTRACT

An apparatus includes a plurality of multiplication circuits for accurately performing small scale multiplication of analog signals with digital signals. The multiplication circuits (M0-M7) are arranged in parallel, receiving an analog signal (X) and bits of a digital signal B. Each circuit generates an output corresponding to a multiplication of the analog signal (X) with a digital bit (B0-B7), that output being based on a weight of the digital signal bit. The outputs generated by each respective multiplication circuit are capacitively coupled to produce an output indicative of multiplication between the digital signal and the analog signal. Each multiplication circuit includes a pair of transistors which receive a common digital signal, and which combine to have switching characteristics of a mutual toggle, alternatively opening and closing.

4 Claims, 2 Drawing Sheets

MULTIPLICATION CIRCUIT

FIELD OF THE INVENTION

The present invention relates to a multiplication circuit.

BACKGROUND OF THE INVENTION

Conventionally, a digital typed multiplication circuit operated only on a large scale and an analog typed multiplication circuit operated with low accuracy in its calculation. Thus, small scale operators which were performed by analog typed multiplication circuits were not very accurate.

SUMMARY OF THE INVENTION

The present invention solves the conventional problems and provides a multiplication circuit capable of performing small scale multiplication with high accuracy. This circuit is also available for performing multiplication of Analog VS. Digital.

A multiplication circuit according to the present invention performs a control whether an analog input voltage is generated to an output terminal or not. By using a digital input voltage as a switching signal, this circuit sets multiplication circuits in a plural of parallel combinations. It then combines an output of each multiplication circuit using a captive coupling, and gives a weight corresponding to a weight of a digital input voltage of each multiplication circuit in a digital input signal formed having a bit string, the bits corresponding to weights of those multiplication circuits.

PREFERRED EMBODIMENT OF THE PRESENT INVENTION

Hereinafter, an embodiment of a multiplication circuit according to the present invention is described referring to the attached drawings.

Figure 1:
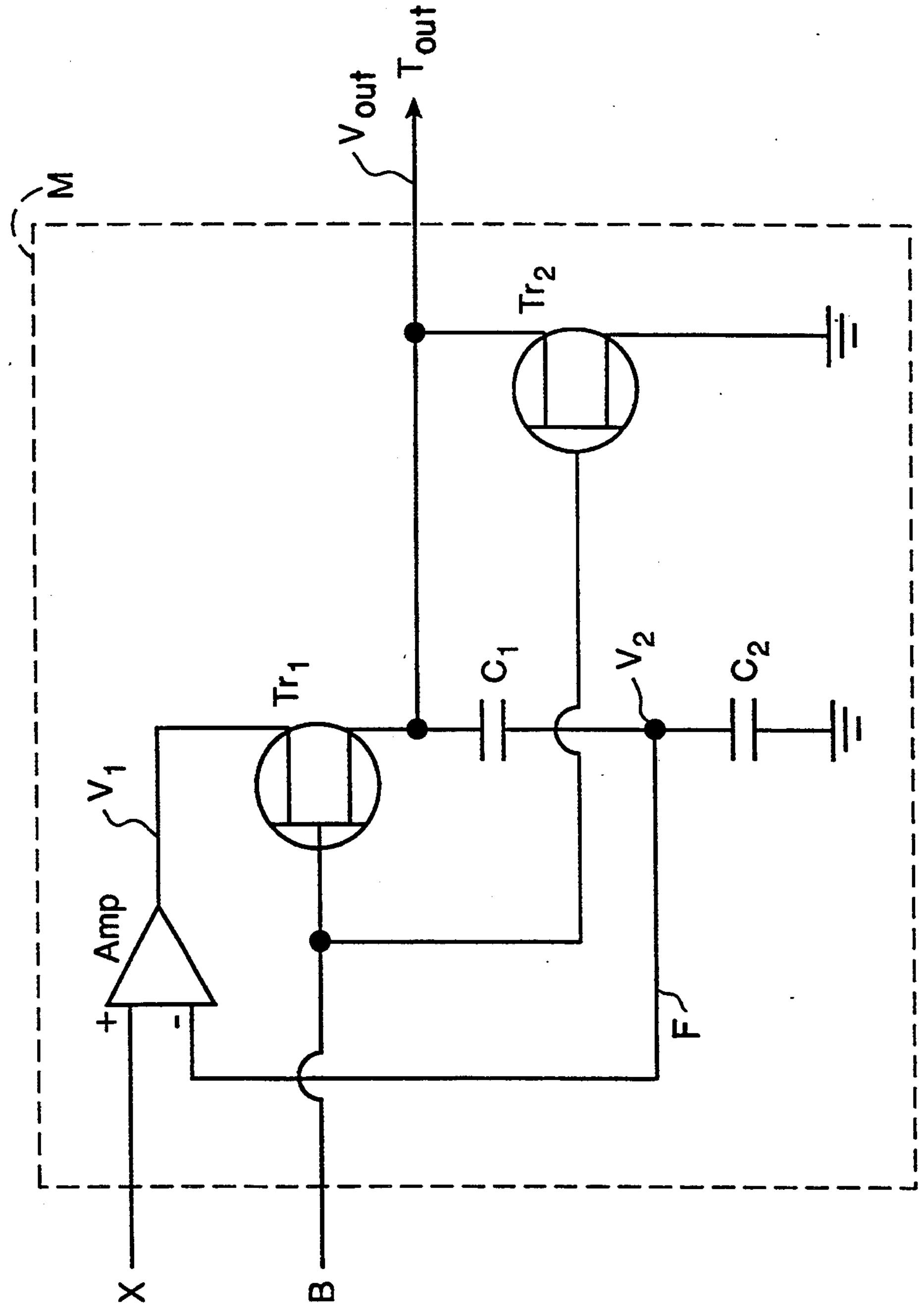
FIG. 1 is a circuit diagram showing the first embodiment of a multiplication circuit relating to the present invention.

FIG. 1, an analog input voltage X in a multiplication circuit M has a calculating amplifier Amp connected with a non-inverted input and an output of Amp is connected with a drain of the first field-effect transistor $Tr_1$. A digital input voltage B is input to a gate of $Tr_1$, and an output terminal $T_{out}$ is connected with a source of $Tr_1$. The first and the second capacitances $C_1$ and $C_2$ are serially connected to a source of $Tr_1$, and a voltage between $C_1$ and $C_2$ is connected to the inverted input of Amp through a feedback circuit F.

If an output voltage of Amp is $V_1$, a voltage of $T_{out}$ is $V_{out}$ and a voltage between $C_1$ and $C_2$ is $V_2$, then Amp controls $V_1$ so that the following formula (1) is realized under a conductive condition of Tr1.

$$(X-V_2)=0 \quad (1)$$

If capacitance value of capacitances $C_1$ and $C_2$ are $C_1$ and $C_2$, respectively, then formula (2) is established.

$$V_{out}=X\{(C_1+C_2)/C_1\} \quad (2)$$

Here, a value of the analog input X multiplied by a constant is outputted at the conductive time of $Tr_1$, because comparative high accuracy of $V_2$ is guaranteed due to the characteristics of the operational amplifier, and the relative accuracy of $C_1$ and $C_2$ is good within one LSI.

Digital input voltage B is input to a gate of Tr1. Tr1 becomes conductive when B is high level and non-conductive when B is low level. Tr2 becomes conductive when B is low level and non-conductive when B is high level. That is, a multiplication result is obtained as shown in Formula (4), where formula (3) is defined and B is a 1 bit data of $2^k$.

$$\{(C_1+C_2)/C_1\}=2^k \quad (3)$$

$$V_{out}=X\times B \quad (4)$$

The second field-effect transistor $Tr_2$ is connected to $T_{out}$ at its drain and $Tr_2$ is grounded at its source and is connected with digital input voltage B at its gate. $Tr_1$ and $Tr_2$ have switching characteristics so that they open and close as a mutual toggle. $Tr_2$ is non-conductive when $Tr_1$ is conductive, and $Tr_1$ is non-conductive when $Tr_2$ is conductive. Therefore, non-conductive, $Tr_2$ conducts to ground $V_{out}$, thereby rendering $V_{out}$ substantially 0V. It can be deemed as a multiplication result when B is equal to 0.

Figure 2:
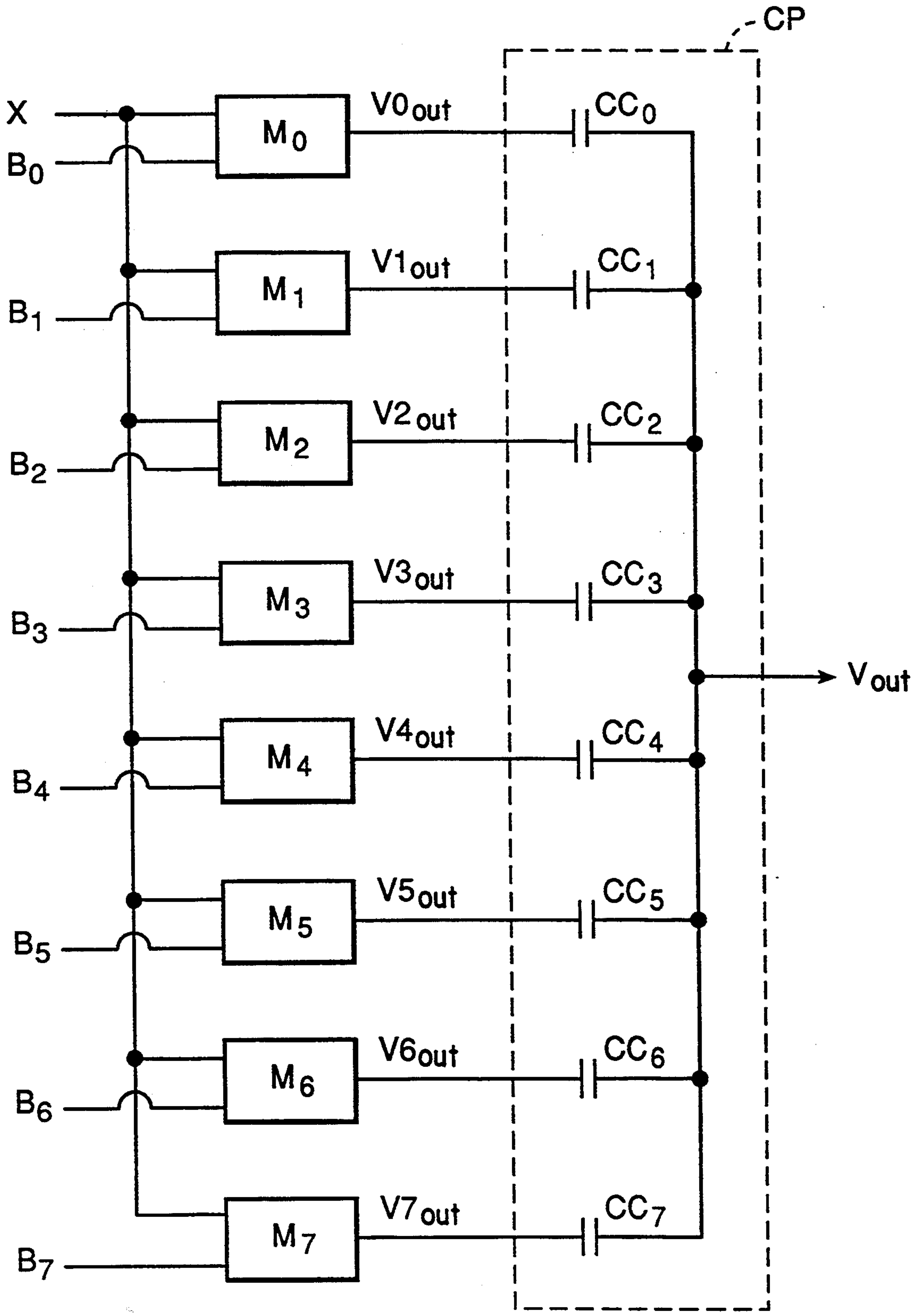
FIG. 2 is a circuit diagram showing the second embodiment of a multiplication circuit relating to the present invention.

FIG. 2 shows a multiplication circuit for a multiplication of 8 bits digital data ($B_0$, $B_1$, . . . $B_7$) and X. Multiplication circuits from $M_0$ to $M_7$, similar to the circuit in FIG. 1, are connected in parallel. Each bit of digital input data is input to each circuit along with a common analog input data X.

If an output voltage of the $k$th multiplication circuit $M_k$ is defined as $V_{kout}$ and capacitances corresponding to $C_1$ and $C_2$ in FIG. 1 are defined as $C_{k1}$ and $C_{k2}$, then $V_{kout}$ is expressed by formula (5).

$$V_{kout}=X\{(C_{k1}+C_{k2})/C_{k1} \quad (5)$$

Furthermore, outputs from $M_0$ to $M_7$ are integrated by a capacitive coupling CP composed of capacitances from $CC_0$ to $CC_7$, and an output $V_{out}$ is generated. A captive coupling CP performs unification by following formula (6).

$$V_{out}=(CC_0\times V_{0out}+CC_1\times V_{1out}+ \ldots +CC_7\times V_{7out})/(CC_0+CC_1+ \ldots +CC_7) \quad (6)$$

That is, a result multiplying formula (7) to output voltage $V_{kout}$ of $M_k$ is summed.

$$CC_k/(CC_0+CC_1+ \ldots +CC_7) \quad (7)$$

And if formula (8) or (9) is established, it means that a multiplication of analog vs. digital is executed.

$$\{(C_{k1}+C_{k2})/C_{k1}\}\times CC_k=2^k \quad (8)$$

$$[\{(CK_1+CK_2)/CK_1\}\times CC_k]/(CC_0+CC_1+ \ldots +CC_7)=2^k \quad (9)$$

It is necessary to determine a final result after multiplying with formula (9).

As mentioned above, a multiplication circuit according to the present invention controls whether an analog input voltage is generated to an output terminal or not by using a digital input voltage as a switching signal, sets multiplication circuits in a plural number of parallels, combines an output of each multiplication circuit by capacitive coupling, and gives a weight corresponding to a weight of a digital input voltage of each multiplication circuit in a plural number of bits of digital input signal so that it is capable of multiplying with small scale and high accuracy but also available for performing multiplication of Analog Vs. Digital.

What is claimed is:

1. An apparatus for multiplying signals comprising:
at least two multiplication circuits which are connected in parallel, each multiplication circuit receiving a common analog input signal and a digital input signal; and
a capacitive coupling circuit having a plurality of capacitances for adjusting weights of said multiplication circuits, one each of said capacitances being connected to an output of each of said multiplication circuits, respectively, each of said capacitance and having a weight corresponding to said digital input signal applied to a corresponding one of said multiplication circuits, an output of each of said capacitances being connected and indicating a multiplied output.

2. A multiplication circuit comprising:
an operational amplifier having an inverting input, a non-inverting input and an output, said non-inverting input receiving an analog input signal;
first switching means having a first controlling terminal, a first input and a first output, said first input being connected with said output of said operational amplifier, said first switching means for controlling a relationship between said first input and said first output based on a digital signal which is input to said first controlling terminal;
first capacitive means having a first terminal and a second terminal, said first terminal being connected with said first output of said first switching means;
second capacitive means having a first terminal and a second terminal, said first terminal of said second capacitive means being connected with said second terminal of said first capacitive means and said second terminal of said second capacitive means being grounded;
an output terminal connected with said first output of said first switching means;
second switching means having a second controlling terminal, a second input and a second output, said second input being connected with said output terminal and said second output being grounded, said second switching means for controlling a relationship between said second input and said second output based on said digital signal which is input to said second controlling terminal; and
feedback means for providing feedback from said second terminal of said first capacitive means and said first terminal of said second capacitive means to said inverting input of said operational amplifier,
said first and second switching means having characteristics of a switching function which operate as a mutual toggle.

3. A multiplication circuit comprising:
i) an operational amplifier having an inverting input, a non-inverting input and an output, said non-inverting input receiving an analog input signal;
ii) a first field-effect transistor having a gate, a source and a drain, said drain being connected with said output of said operational amplifier;
iii) a first capacitance having a first terminal and a second terminal, said first terminal being connected with said source of said first field-effect transistor;
iv) a second capacitance having a first terminal and a second terminal, said first terminal of said second capacitance being connected with said second terminal of said first capacitance and said second terminal of said second capacitance being grounded;
v) an output terminal connected with said source of said first field-effect transistor;
vi) a second field-effect transistor having a gate, a source and a drain, said drain being connected with said output terminal and said source being grounded; and
vii) a feedback circuit connecting said second terminal of said first capacitance and said first terminal of said second capacitance with said inverted input of said operational amplifier,
said gate of said first field-effect transistor and said gate of said second field-effect transistor receiving a digital input signal,
said first and second field-effect transistors having characteristics of a switching function which operate as a mutual toggle.

4. An apparatus for multiplying signals comprising:
at least two multiplication circuits which are connected in parallel, said multiplication circuits including:
i) an operational amplifier having an inverting input, a non-inverting input and an output, said non-inverting input receiving an analog input signal;
ii) a first field-effect transistor having a gate, a source and a drain, said drain being connected with said output of said operational amplifier, said gate receiving a digital input signal;
iii) a first capacitance having a first terminal and a second terminal, said first terminal being connected with said source of said first field-effect transistor;
iv) a second capacitance having a first terminal and a second terminal, said first terminal of said second capacitance being connected with said second terminal of said first capacitance and said second terminal of said second capacitance being grounded;
v) an output terminal connected with said source of said first field-effect transistor;
vi) a second field-effect transistor having a gate, a source and a drain, said drain being connected with said output terminal and said source being grounded, said gate receiving said digital input signal; and
vii) a feedback circuit connecting said second terminal of said first capacitance and said first terminal of said second capacitance with said inverted input of said operational amplifier,
said first and second field-effect transistors having characteristics of a switching function which operate as a mutual toggle; and
a capacitive coupling circuit having a plurality of third capacitances for adjusting a weight of said multiplication circuits, a third capacitance being connected to said output terminal of each said multiplication circuit and having a weight corresponding to said digital input signal applied to said multiplication circuit, an output of said third capacitances being connected and indicating a multiplied output.

* * * * *